United States Patent [19]
McEwan et al.

[11] Patent Number: 5,804,921
[45] Date of Patent: Sep. 8, 1998

[54] SOLITON QUENCHING NLTL IMPULSE CIRCUIT WITH A PULSE FORMING NETWORK AT THE OUTPUT

[75] Inventors: Thomas E. McEwan; Gregory E. Dallum, both of Livermore, Calif.

[73] Assignee: The Regents of the University of California, Oakland, Calif.

[21] Appl. No.: 614,408

[22] Filed: Mar. 12, 1996

Related U.S. Application Data

[63] Continuation-in-part of Ser. No. 194,029, Feb. 9, 1994, abandoned.

[51] Int. Cl.⁶ .................................................. H03K 3/36
[52] U.S. Cl. ........................... 315/20; 327/181; 327/335; 307/106
[58] Field of Search ..................... 333/19, 20; 327/181, 327/194, 335, 586; 309/105–109

[56] References Cited

U.S. PATENT DOCUMENTS

| | | | |
|---|---|---|---|
| 2,871,453 | 1/1959 | Bradley | 333/20 |
| 3,002,113 | 9/1961 | Winn | 333/20 X |
| 3,098,980 | 7/1963 | Dodington | 327/181 X |
| 4,855,696 | 8/1989 | Tan et al. | 333/20 |
| 5,023,574 | 6/1991 | Anklam et al. | 333/20 |
| 5,274,271 | 12/1993 | McEwan | 333/20 X |
| 5,422,607 | 6/1995 | McEwan | 333/20 |

OTHER PUBLICATIONS

R.A. Marsland et al., 130 GHz GaAs monolithic integrated circuit sampling head, 07 Aug. 1989, Applied Physics Letters, vol. 55, No. 6, pp. 592–594.

*Primary Examiner*—Robert Pascal
*Assistant Examiner*—Justin P. Bettendorf
*Attorney, Agent, or Firm*—Henry P. Sartorio; John P. Wooldridge

[57] ABSTRACT

An impulse forming circuit is disclosed which produces a clean impulse from a nonlinear transmission line compressed step function without customary soliton ringing by means of a localized pulse shaping and differentiating network which shunts the nonlinear transmission line output to ground.

10 Claims, 3 Drawing Sheets

5,804,921

SOLITON QUENCHING NLTL IMPULSE CIRCUIT WITH A PULSE FORMING NETWORK AT THE OUTPUT

RELATED APPLICATIONS

The application is a continuation-in-part of U.S. patent application Ser. No. 08/194,029, filed Feb. 9, 1994 now abandoned.

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to a NonLinear Transmission Line (NLTL) type circuit and more specifically to a reverse biased varactor diode loaded circuit designed to form an impulse from an incoming stepped pulse. In particular, the invention describes a method and means for generating an impulse while concomitantly eliminating self sustained soliton ringing components encountered in a NLTL impulse generator circuit.

2. Description of Related Art

Shock lines and nonlinear transmission lines have been conceived and have been in use for over half a century in this country. Until recently, application of the NLTL has been confined primarily to a series of inductor-capacitor, low pass filter circuits for magnetic pulse compressors. More recent developments have led to diode loaded shock lines, which has in turn led to development of impulse circuits.

In a typical NLTL, a number of inductor-capacitor (LC) stages are coupled in a series of stages, wherein each LC stage comprises an inductor in series with the next stage with a capacitor to ground in each stage. Recent developments have brought rise to a new class of NLTL wherein the capacitors to ground are replaced with reverse biased, varactor diodes which act as variable capacitors with capacitance dependent on voltage applied. Initially, with no signal across the varactors, the depletion layer across the PN junction of each individual diode is at a minimum which correlates to a minimum gap between effective capacitor plates and therefor a maximum capacitance for each varactor cell or stage. When a negative, reverse bias voltage is applied to the varactor, the depletion layer of the PN junction is widened, which effectively decreases the capacitance of each respective varactor. Therefore, as a negative input signal/pulse rises across the NLTL, the reverse bias voltage causes each varactor cell to experience an initial large capacitance which, as the capacitance varies with voltage across the diode, rapidly diminishes to a minimum capacitance in accordance with a varying and decreasing time constant per stage given by the square root of inductance times capacitance $(LC)^{1/2}$.

Since the voltage and related capacitance diminishes per stage, so too does the indirectly related time constant. The incoming voltage pulse drop is effectively delayed a little longer in each succeeding stage before dropping to a minimum level due to the inherent maximum capacitive effect of the respective varactor whose capacitance diminishes as the reverse voltage across it increases in time.

Varactor NLTL work has been conducted at Stanford University and Hewlett Packard (HP) resulting in generation of very fast, transients in such NLTLs, as disclosed in Anklam, et al., U.S. Pat. No. 5,923,574. A major problem, however, with existing NLTLs is that the waveform that shock lines produce when driven into shock almost always contains a form of ringing known as solitons. Solitons are, in effect, the ringing components that are self sustained by the nonlinearity of the line. HP recently developed a technique to suppress ringing on a NLTL disclosed in Tan et al., U.S. Pat. No. 4,855,696. The HP technique involved the use of damping, or Q spoiling, resistors and combinations of various diode types which yielded various capacitance-voltage (CV) profiles. A central problem with the HP technique is that the process is not readily compatible with integrated circuit processing because the CV profile is generally set on a wafer scale by conventional manufacturing processes. Therefore, individual diodes on the same wafer cannot conveniently have different CV profiles. In addition, the integration of damping resistors adds processing steps to a monolithic NLTL, and resistive damping is a power robbing method to control ringing. The signal would be substantially attenuated at the output.

Existing art high performance NLTLs produce so much ringing that such lines are usable for only the crudest of applications. A well controlled waveform or impulse is essential for many short range sensor and radar imaging applications. If a transmitted radar waveform or impulse is still ringing when the receive antenna is trying to detect the impulse echo, the ringing from the nearby transmit antenna will mask the echo received. Indeed, there exists a long standing need for an ultra wideband impulse radar sensor for automotive applications in which it is conceived that the present invention will be implemented. In ultra wideband radar imaging applications, the ringing observed on the transmitted pulse smears the image contrast. In addition, many high speed electronic applications require clean, picosecond speed, impulse waveforms heretofore not available in the existing art such as a strobe generator for an ultra highspeed sampling system.

In a NLTL pulse generator circuit, a reverse biased, diode loaded nonlinear transmission line compresses a relatively slow input transient through the nonlinear variation in junction capacitance of the reverse biased varactor diodes periodically located along the transmission line as described above. Effect of the line is such that the leading edge of a step function is compressed or accelerated and the trailing edge is lengthened or slowed. Therefore, a NLTL may generally be used for leading edge compression of a voltage step function.

Recent applications, however, require generation of an impulse function rather than a compressed step function. Consequently, a means for converting a step function into an impulse function is needed. Such means is conventionally accomplished by a differentiator circuit disclosed in the present invention in the form of a series capacitor with a resistor or inductor shunted to ground.

Undesirable problems, however, are encountered on differentiation of the output of a nonlinear transmission line because, as discussed above, NLTLs invariably bring rise to soliton ringing, inherently generated due to the non linear nature of a NLTL. The undesirable solitons pass freely through the differentiator and degrade the output pulse.

Prior art methods of producing an impulse from a NLTL at Stanford University and Hewlett Packard rely on a pulse differentiation method using a circuit that is located remotely from the NLTL; reference "130 GHz GaAs Monolithic Integrated Circuit Sampling Head", Marsland, Valdivia, Madden, Rodwill, and Bloom, Applied Physics Letters, Aug. 7, 1989. A limitation of this method, however, is that solitons generated in such a NLTL cannot be discriminated against or identified from the leading edge of the signal that is to be differentiated in the NLTL. Many high performance NLTLs generate substantial ringing of their own accord, often in the realm of twenty percent of the step amplitude. A differentiated step pulse contains an even higher relative percentage of ringing, and impulses with greater than twenty percent ringing are unsuitable for most applications, such as gating sampling circuits, since multiple gating can occur.

The invention disclosed herein solves the aforementioned ringing problem by incorporating a differentiator into a NLTL in such manner that the bandwidth of the NLTL is reduced. With such a bandwidth limitation, solitons are effectively terminated from propagation immediately after impulse formation and therefor do not pass freely through the differentiator to degrade the output impulse.

As a further improvement over the prior art, the layout of the invention herein produces an ideal impulse, with nominal additional components. Of particular significance is the fact that the invention is widely applicable to many forms of nonlinear transmission lines including magnetic shock lines.

SUMMARY OF THE INVENTION

An object of the invention is to provide a high performance shock line without soliton ringing.

Another object is to provide a NLTL compressed step function generator without soliton ringing.

Another object is to implement a NLTL impulse function generator without soliton ringing.

Another object is provide a circuit that can yield a clean impulse waveform applicable to high speed electronics such as a strobe generator for picosecond speed sampling systems.

The invention is a NLTL high power short pulse generator circuit and process for initially generating a compressed step pulse function which is operated upon by a differentiation circuit to yield an impulse function without soliton ringing. The circuit consists of a ladder or series of stages of pulse forming networks in which each stage is described by a series inductor with a voltage dependent variable capacitor, or varactor, to ground. The varactors are reverse biased such that each varactor initially presents a maximum capacitance that drops under a time constant $(LC)^{1/2}$ to a minimum, with the delay increasing for each stage causing the input pulse to be steepened and sharpened. An inductor to ground is applied at the end of the series of stages and functions both as a differentiation element and as an impedance to ground element which causes the varactors to increase capacitance when the impulse function passes through zero. Differentiation of the shaped step pulse yields a desired spiked pulse while concomitantly damping out entirely any following soliton ringing effects traditionally associated with a shock line to produce an ideal and clean impulse wave form output. For the inductor or other differentiating network to rapidly reduce the varactor voltage during output impulse formation, it is essential that the inductor be physically located at the exact location of the last varactor diode, or within an electrical propagation length of ½ of the output pulse width.

DETAILED DESCRIPTION OF THE INVENTION

Figure 1:
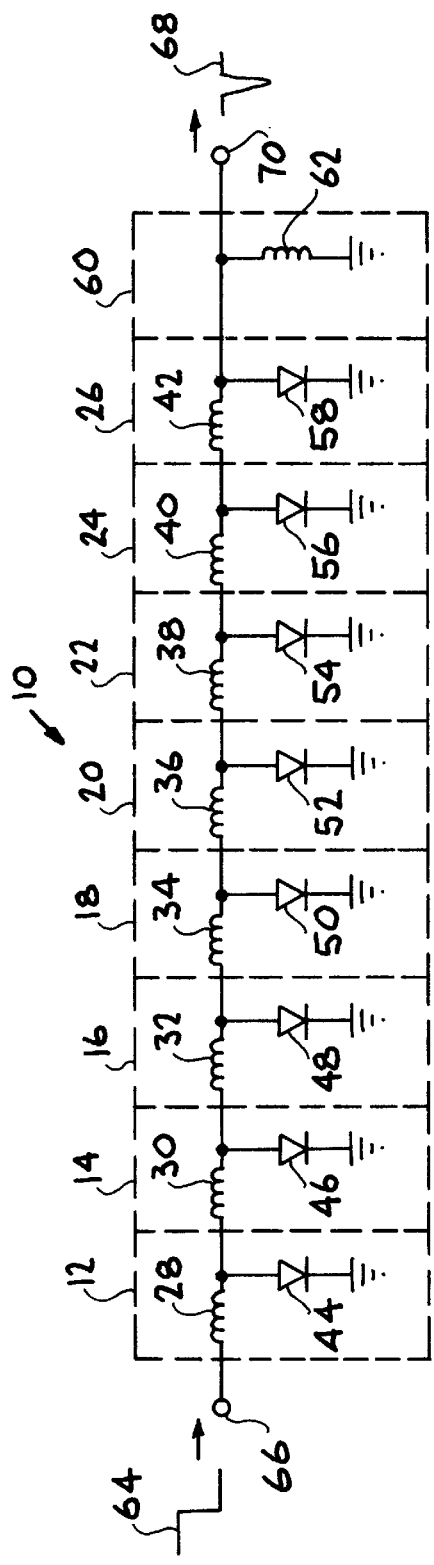
FIG. 1 illustrates a theoretical schematic of the Soliton Quenching Impulse Circuit.

A detailed schematic of one embodiment of the invention is illustrated in FIG. 1. The invention is essentially a non ringing impulse generator circuit and consists in part of a nonlinear transmission line (NLTL) 10 containing, in a preferred embodiment, eight series coupled stages 12–26 of pulse forming network (PFN) elements with inductors (L) 28–42 and capacitors (C) in the form of reverse biased varactor diodes 44–58 shunted to ground in each stage. Varactor diodes 44–58 may alternatively be PIN diodes. A final stage 60 coupled to the terminal end of NLTL 10 is a differentiator circuit consisting of a differentiating inductor 62 shunted to ground. NLTL 10 is conventionally tapered in L and C to decrease the time constant $(LC)^{1/2}$ along the line to sharpen a stepped pulse along the line. One tapered orientation sets inductors 28–34 at 4.5 nH value and inductors 36–42 at 2.2 nH value. Correspondingly, varactors 44–54 are given a value of 1.5 pF and varactors 56 and 58 are established at 0.75 pF. By such means, a stepped pulse or falling edge 64 applied to an input 66 of NLTL 10 is shaped and sharpened by tapered NLTL 10 through stages 12–26, and is finally acted upon by a differentiator stage 60 to yield a very narrow differentiated pulse 68 at output 70 of NLTL 10. For the inductor or other differentiating network to rapidly reduce the varactor voltage during output impulse formation, it is essential that the inductor be physically located in parallel with the last varactor diode, or within an electrical propagation length of ½ of the output pulse width.

Figure 2:
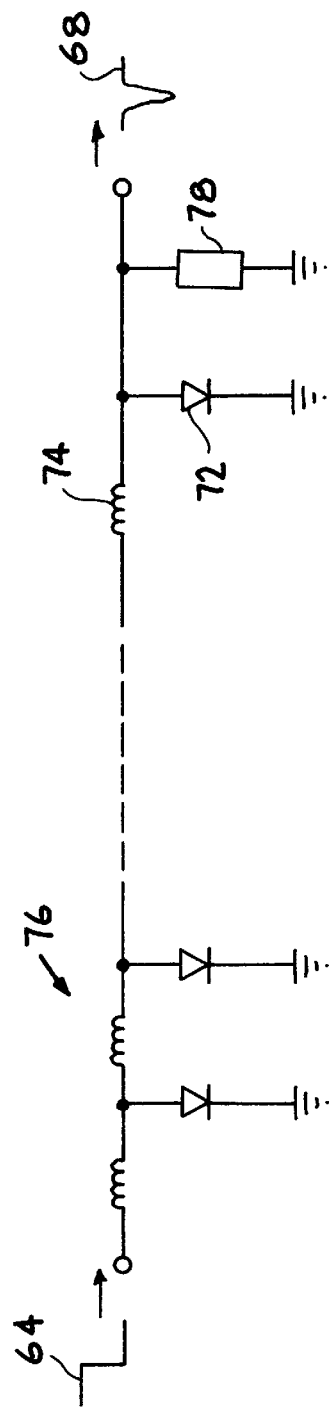
FIG. 2 illustrates a schematic of a preferred embodiment, best mode of operation circuit.

A more generalized concept of the impulse generator circuit envisioned by the invention is illustrated in FIG. 2. The circuit of FIG. 2 consists of an indefinite number of reverse biased varactor diodes 72 and corresponding inductors 74 forming a NLTL 76 with a pulse forming network 78 in shunt to ground placed at the output end of NLTL 76. Pulse forming network 78, as illustrated in FIG. 1, may be a simple inductor coupling the NLTL output to ground, but it will be appreciated that any preferred pulse generating circuit may alternatively be applied. More complex networks could consist of combinations of elements such as a pulse forming network (PFN) with its input connected to the NLTL output and the output of the PFN connected to ground. Another alternate pulse forming network is envisioned in which a short length of transmission line may be used where the electrical length of the line defines the output pulse width and where the input of the line is connected to the NLTL output and the output of the line is shunted to ground.

In the generalized invention concept of FIG. 2, the LC product in the NLTL may be, but need not be, commensurate in LC product values. In addition, the voltage (V) dependent capacitance (C) of varactor diodes 72, generally referred to as the C - V profile, is arbitrary, with the only limitation that C must necessarily decrease with increasing applied reverse bias V.

The invention operates by automatic bandwidth reduction in NLTL 76. Shunt pulse forming network 78 is used to rapidly reduce NLTL output voltage during the differentiation process. In so doing, the capacitance of varactor diodes 72 is increased many fold as the NLTL voltage goes to zero. Thus, at the trailing edge of the differentiated pulse where the NLTL voltage approaches zero, the bandwidth of the NLTL is decreased by the square root of the change in capacitance.

It will be appreciated that the frequency of soliton ringing is related to the cutoff frequency of the NLTL and is approximated in consideration of a large signal (ls) diode capacitance (C) according to the following formula:

$$fls = \tfrac{1}{2}\pi(LCLs)^{1/2}$$

where fls is the frequency of soliton ringing, L is the inductance, and CLs is the large signal varactor diode capacitance.

The sudden reduction in cutoff frequency as the output network swings the NLTL voltage to zero reduces the bandwidth of the NLTL to the point that existing solitons cannot propagate. The bandwidth of the NLTL when the diode capacitance is biased near zero volts is:

$$fo = \tfrac{1}{2}\pi(LCo)^{1/2}$$

where fo is the bandwidth of the NLTL and LCo is the inductance when the diode capacitance is biased near zero volts.

With diode capacitance at zero volts, frequency (fo) is many fold less than the bandwidth of the NLTL when operated over its maximum rated voltage range. Since each succeeding NLTL inductor—capacitor stage (LC) is essentially a second order filter, a three fold reduction in bandwidth will introduce a nine fold attenuation per LC stage on soliton component ringing. Because pulse forming network 78 is shunted to ground, it reduces the NLTL bandwidth at just the right point in time, such that as the sharpened step pulse is differentiated by network 78, the differentiated pulse is followed by an automatic reduction in bandwidth.

Figure 3:
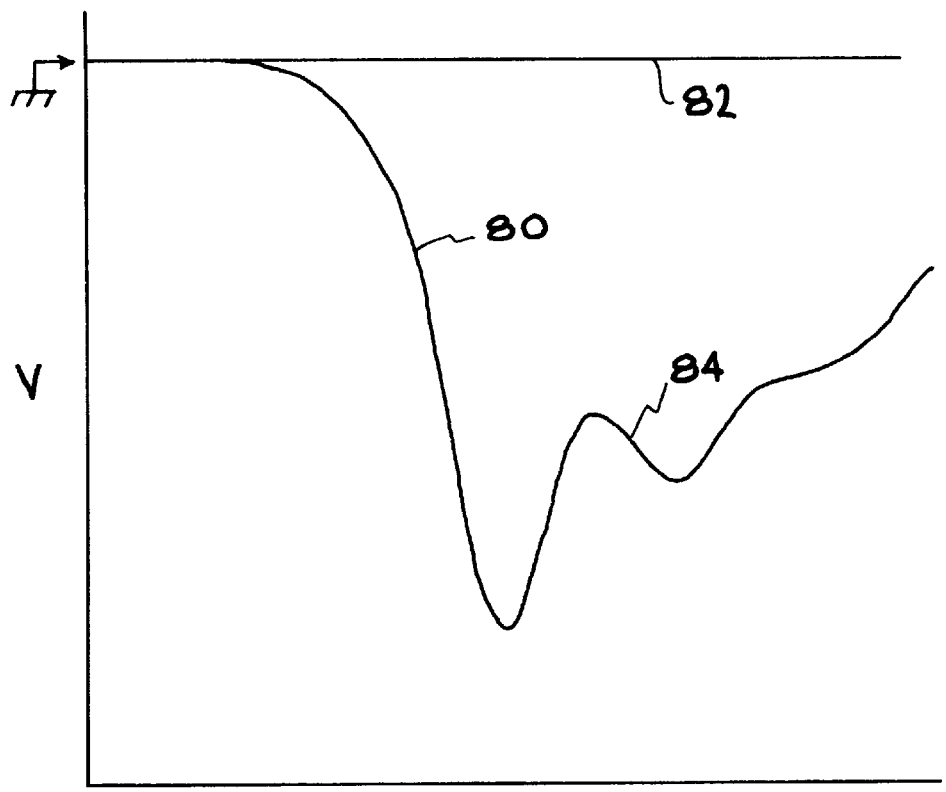
FIG. 3 illustrates an oscilloscope trace of a NLTL output without the invention.
Figure 4:
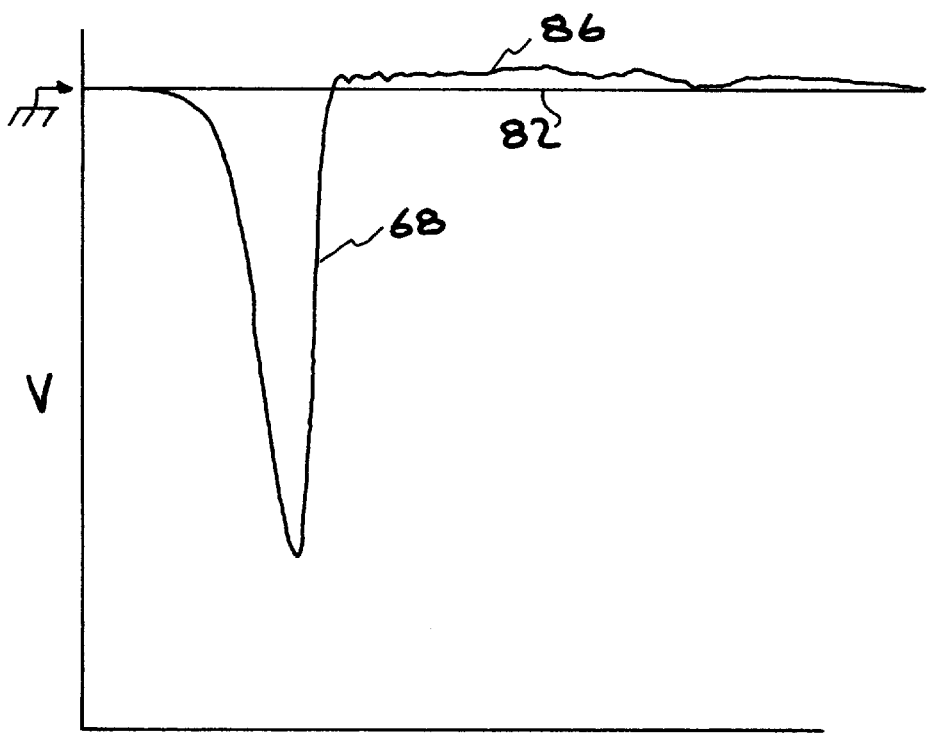
FIG. 4 illustrates an oscilloscope trace of a NLTL output with the invention.

Referring now to FIG. 3, an oscilloscope trace (neg volt, V, vs time, T, in nanoseconds) of an output of a conventional NLTL without the pulse forming differentiation network 78 of the invention attached thereto. It can be observed that a compressed stepped pulse output 80 is produced below a dotted/dashed ground line 82, but with invariable and substantial soliton ringing 84. FIG. 4, on the other hand, illustrates an oscilloscope trace (neg volt, V, vs time, T, in ns) of an output of a NLTL with the pulse forming differentiation network 78 of the invention included therein. It can be observed that a compressed impulse output 68 is produced below dotted/dashed ground line 82, and without the soliton ringing of FIG. 3. Indeed, impulse 68 may shoot slightly over ground zero line 82 at 86 causing varactor diodes 72 of NLTL 76 to be forward biased and thereby clamping, through conduction, any soliton ringing energy out of the system. This phenomena is an additional positive benefit of the invention which may additionally contribute to a clean pulse formation under certain conditions.

When output network 78 swings the output voltage towards zero, the output voltage may, as illustrated in FIG. 4, swing the pulse past zero and forward bias the NLTL varactor diodes 72. By adding an impedance to ground at the NLTL/shockline output, the impedance pulls the leading edge voltage back to ground. Pulling the voltage to ground increases the capacitance of the varactors, which in turn increases the LC time constant. The long time constant outlasts the periodic oscillation of the soliton ringing. It is not initially obvious, but the ringing is shorted out by the varactors. If the voltage is pulled past zero, the varactors are forward biased and start to conduct in a matter of picoseconds. This is a form of self clamping to clamp out ringing. The self clamping effect illustrated in FIG. 4 shows an exceedingly sharp corner on the trailing edge of pulse 68. Numerical simulations (SPICE) indicate that the NLTL output diode is driven into conduction, and that the conduction effect ripples in a reverse direction to each diode 72 along NLTL 76. This successive conduction further suppresses solitons. Although the clamping effect is an enhancement to the invention, it is not the primary effect of the invention, which is to eliminate soliton ringing on a differentiated step pulse. It should be noted that even without diode conduction, ringing is eliminated.

Figure 5:
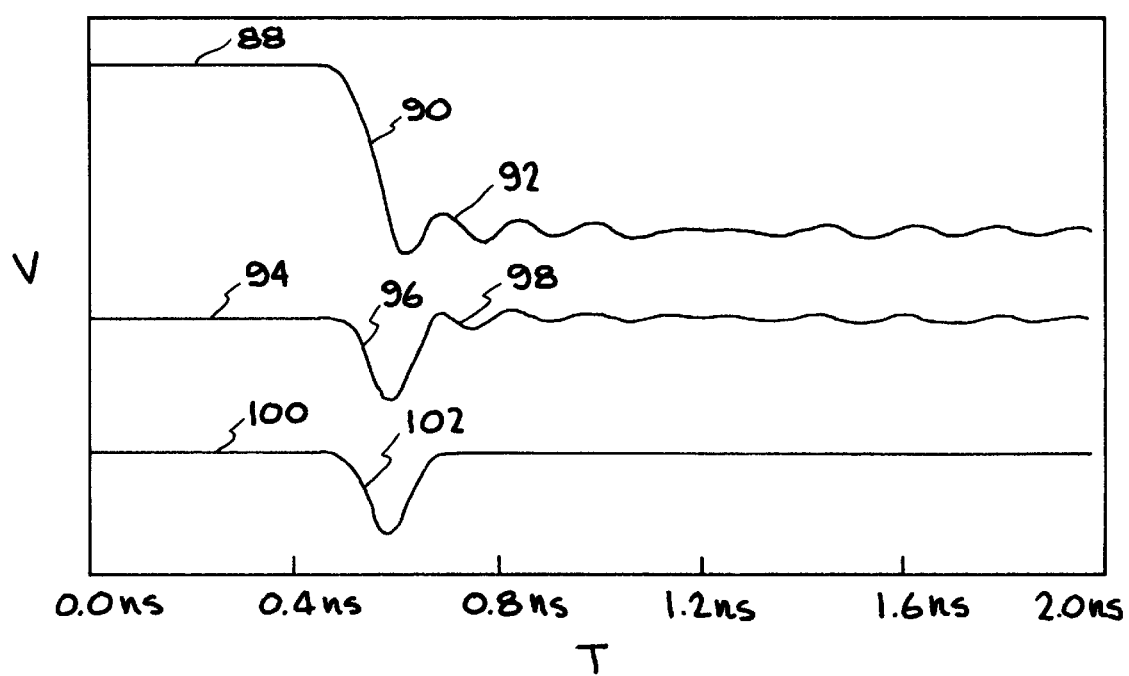
FIG. 5 illustrates a triple numerical simulation (SPICE) trace of an NLTL output without differentiation (top), with simple differentiation (middle), and with the clamped varactor differentiation (bottom) disclosed in the invention.

FIG. 5 summarizes the function, novelty, and utility of the invention. FIG. 5 is a SPICE numerical simulation, triple trace of voltage V vs time T in ns of a NLTL output. Top trace 88 indicates a conventional NLTL compressed step 90 output but without the invention and therefor with customary soliton ringing 92. Center trace 94 illustrates conventional differentiation of an NLTL pulse to yield an impulse output 96 but without the invention and therefor without customary soliton ringing 98. Bottom trace 100 indicates an output of a NLTL incorporating the invention pulse shaping differentiating circuit element 78 and yielding a clean impulse 102 without any soliton ringing. FIG. 5 also gives an accurate estimate of impulse 102 shape and duration of approximately 0.2 ns.

Although the invention herein above disclosed has been described in detail with reference to a particular example of an embodiment, persons possessing skill in the art to which this invention pertains will appreciate that various modifications and enhancements can be made without departing from the overall spirit and scope or the invention as defined and limited only by the following appended claims.

We claim:

1. A nonlinear transmission line (NLTL) impulse generator, comprising:
    a NLTL having an input and an output, and consisting of a plurality of inductors and reverse biased varactor diodes; and
    a pulse forming network (PFN) connected in shunt between said output of said NLTL and ground, wherein said PFN is electrically connected in parallel with the last varactor diode of said plurality of reverse biased varactor diodes wherein said PFN is located within ½ of a pulse length in electrical length of said NLTL output, wherein said PFN rapidly reduces a NLTL output voltage to differentiate said NLTL output voltage.

2. The nonlinear transmission line (NLTL) impulse generator of claim 1, wherein said PFN comprises a transmission line that is shunted to ground.

3. A NLTL impulse generator according to claim 1, wherein said reverse biased varactor diodes diminish in capacitance from said NLTL input to said NLTL output.

4. A NLTL impulse generator according to claim 1, wherein said plurality of inductors diminish in inductance from said NLTL input to said NLTL output.

5. A NLTL impulse generator according to claim 1, wherein said NLTL is tapered.

6. A NLTL impulse generator according to claim 5, wherein an LC product diminishes from said NLTL input to said NLTL output.

7. A NLTL impulse generator according to claim 1, wherein said pulse forming network comprises a differentiation circuit.

8. A NLTL impulse generator according to claim 7, wherein said differentiation circuit comprises an inductor.

9. A NLTL impulse generator according to claim 7, wherein said differentiation circuit comprises a short piece of transmission line.

10. A NLTL impulse generator according to claim 7, wherein said differentiation circuit rapidly reduces said NLTL output voltage during said differentiation process.

* * * * *